(12) United States Patent
Knutson (10) Patent No.: US 9,935,661 B2
(45) Date of Patent: Apr. 3, 2018

(54) APPARATUS AND METHOD FOR CONTROLLING A FILTER IN A SIGNAL COMMUNICATION DEVICE

(71) Applicant: THOMSON LICENSING, Issy de Moulineaux (FR)

(72) Inventor: Paul G Knutson, Westfield, IN (US)

(73) Assignee: THOMSON LICENSING, Issy les Moulineaux (FR)

( * ) Notice: Subject to any disclaimer, the term of this patent is extended or adjusted under 35 U.S.C. 154(b) by 185 days.

(21) Appl. No.: 15/083,346

(22) Filed: Mar. 29, 2016

(65) Prior Publication Data

US 2017/0237450 A1 Aug. 17, 2017

Related U.S. Application Data

(60) Provisional application No. 62/295,527, filed on Feb. 16, 2016.

(51) Int. Cl.
| | |
|---|---|
| *H04B 1/00* | (2006.01) |
| *H04L 12/66* | (2006.01) |
| *H01P 1/213* | (2006.01) |
| *H03H 7/46* | (2006.01) |
| *H04N 7/173* | (2011.01) |
| *H04N 21/61* | (2011.01) |

(52) U.S. Cl.
CPC ............ *H04B 1/0057* (2013.01); *H01P 1/213* (2013.01); *H04L 12/66* (2013.01); *H03H 7/463* (2013.01); *H04B 1/006* (2013.01); *H04N 7/17309* (2013.01); *H04N 21/6118* (2013.01); *H04N 21/6168* (2013.01)

(58) Field of Classification Search
CPC ....... H04B 1/0057; H04L 12/66; H01P 1/213; H03H 7/463; H04N 7/17309; H04N 21/6118; H04N 21/6168
See application file for complete search history.

(56) References Cited

U.S. PATENT DOCUMENTS

| | | |
|---|---|---|
| 6,320,878 B1 | 11/2001 | Krimmel et al. |
| 8,832,767 B2 | 9/2014 | Olson et al. |
| 9,071,388 B2 | 6/2015 | Zeng et al. |
| 9,100,061 B2 | 8/2015 | Zeng et al. |
| 9,124,405 B2 | 9/2015 | Lovell |

(Continued)

FOREIGN PATENT DOCUMENTS

WO    WO2013089997    6/2013

*Primary Examiner* — Brian D Nguyen
(74) *Attorney, Agent, or Firm* — Brian J. Dorini; Patricia A. Verlangieri (57) ABSTRACT

A communication device comprises a processor; and a diplexer comprising a low pass filter passing signals with frequency below a first frequency threshold, the low pass filter having a first input and a first output, and a second filter being one of a high pass filter and a band pass filter passing signals with frequency above a second frequency threshold, the second filter having a second input and a second output; and a switch controllable by the processor for connecting the second input to a termination in a first state and connecting the second input to the first input in a second state responsive to a control signal from the processor, wherein the first output is coupled to the second output and the first input is configured to receive an input signal having a frequency range covering at least the first frequency threshold.

15 Claims, 6 Drawing Sheets

(56) References Cited

U.S. PATENT DOCUMENTS

| | | | | |
|---|---|---|---|---|
| 2009/0170445 A1* | 7/2009 | Wang | ............... | H03J 3/08 |
| | | | | 455/77 |
| 2009/0286501 A1* | 11/2009 | Rousu | ............... | H04B 1/525 |
| | | | | 455/323 |
| 2010/0251314 A1* | 9/2010 | Olson | ............... | H04N 7/104 |
| | | | | 725/107 |
| 2011/0255452 A1 | 10/2011 | Brooks | | |
| 2013/0070772 A1* | 3/2013 | Watson | ............... | H04H 20/78 |
| | | | | 370/400 |
| 2013/0080817 A1* | 3/2013 | Mihelic | ............... | G06F 1/12 |
| | | | | 713/401 |
| 2013/0157717 A1 | 6/2013 | Yu et al. | | |
| 2014/0321341 A1* | 10/2014 | Kristiansen | ......... | E21B 33/0355 |
| | | | | 370/297 |
| 2015/0341196 A1* | 11/2015 | Sorrells | ............... | H03C 1/62 |
| | | | | 375/302 |
| 2016/0198347 A1* | 7/2016 | Zhan | ............... | H04B 1/40 |
| | | | | 455/23 |

\* cited by examiner

APPARATUS AND METHOD FOR CONTROLLING A FILTER IN A SIGNAL COMMUNICATION DEVICE

REFERENCE TO RELATED PROVISIONAL APPLICATION

This application claims priority from U.S. Provisional Application No. 62/295,527, entitled "APPARATUS FOR CONTROLLING A FILTER IN A SIGNAL COMMUNICATION DEVICE," filed on Feb. 16, 2016, the contents of which are hereby incorporated by reference in its entirety.

TECHNICAL FIELD

The present disclosure relates generally to communication systems, and more particularly, to an apparatus and method for controlling a filter circuit in a signal communication device.

BACKGROUND

Any background information described herein is intended to introduce the reader to various aspects of art, which may be related to the present embodiments that are described below. This discussion is believed to be helpful in providing the reader with background information to facilitate a better understanding of the various aspects of the present disclosure. Accordingly, it should be understood that these statements are to be read in this light.

Today, modems, such as cable modems, offer Internet connectivity to subscribers' homes. These modems are typically connected to an information distribution network, such as a coaxial cable network, an optical fiber network, a hybrid fiber/coaxial cable network, or a wireless network, and communicate with a network device outside the home (e.g., a termination system, such as a cable modem termination server (CMTS)). Within the home, the modem may be connected to an in-home network, such as an Ethernet network, an in-home coaxial cable network (e.g., per the Multimedia over Coax Alliance—(MoCA) specification), wireless network, etc., and various devices within the home may use that network to ultimately communicate with network devices outside the home. Additionally, the modem may provide telephone services to the home (e.g., Voice over IP (VoIP) services). Such multi-function modems are commonly referred to as a gateway or gateway device.

The communication protocol used in a cable network between the home device (e.g., cable modem or gateway) and the CMTS is referred to as Data over Cable Service Interface Specification (DOCSIS). The latest protocol that is available today is DOCSIS version 3.1 and, among other changes from earlier versions, expands the possible operating range for upstream communication. Previous versions of DOCSIS used an upstream frequency band from 5 Megahertz (MHz) to 42 MHz. All consumer premises equipment (CPE) devices that are connected to the CMTS in this network, whether set-top boxes (STBs), cable modems, cable modems with integrated voice, routers or Wi-Fi (Gateways) operate using upstream signaling within that frequency range.

However, due to expansion of the network capabilities and a need for higher bandwidth for the upstream communication, DOCSIS 3.1 allows for expanding the upstream frequency range from 5-42 MHz to 5-85 MHz. Future upgrades may expand the range further. However, not all networks may be upgraded at the same time. As a result, the new portion of the expanded upstream frequency range, from 42 MHz to 85 MHz may still be used for downstream communications in some networks. In order to meet these two environments, service providers may deploy two different products using two different input filter circuits or diplexers, one for each environment. Alternatively, the network and service provider may temporarily remove the overlapping downstream communication signals for frequencies below 85 MHz in case they want to deploy a device including a single fixed 5-85 MHz upstream filter. These approaches are not optimal. Therefore, a need exists for a single switchable filter structure that is operable in either one of two network communication configurations and further includes the capability to control the switching of the filter structure.

SUMMARY

In accordance with an aspect of the present disclosure, a communication device is disclosed. The communication device comprises a processor; and a diplexer comprising a low pass filter passing signals with frequency below a first frequency threshold, the low pass filter having a first input and a first output, and a second filter being one of a high pass filter and a band pass filter passing signals with frequency above a second frequency threshold, the second filter having a second input and a second output; and a switch controllable by the processor for connecting the second input to a termination in a first state and connecting the second input to the first input in a second state responsive to a control signal from the processor, wherein the first output is coupled to the second output and the first input is configured to receive an input signal having a frequency range covering at least the first frequency threshold. In one embodiment, the frequency range covers the second frequency threshold.

In one embodiment, the diplexer further comprises a third filter being one of a high pass filter and a band pass filter passing signals with frequency above a third frequency threshold greater than the second frequency threshold, and an output of the third filter is coupled to the first and the second outputs.

In one embodiment, the frequency range is one of 5-42 MHz and 5-85 MHz, and the first, second frequency thresholds are respectively 42 MHz and 54 MHz.

In one embodiment, the communication device is a cable modem and the processor is configured to determine upstream bandwidth requirement.

In one embodiment, the upstream bandwidth requirement is determined to be a first bandwidth, the processor is configured to generate the control signal to place the switch in the first state, and if the upstream bandwidth requirement is determined to be a second bandwidth, the processor is configured to generate the control signal to place the switch in the second state.

In one embodiment, the first bandwidth is 5-42 MHz and the second bandwidth is 5-85 MHz.

In accordance with another aspect of the present disclosure, a method of providing an upstream signal in a cable network is disclosed. The method comprises determining upstream bandwidth requirement; receiving upstream data; if the upstream bandwidth requirement is determined to be a first bandwidth, operating a switch to pass an input signal representing the upstream data through a low pass filter passing signals with frequency below a first frequency threshold to provide the upstream signal, the input signal bypassing a second filter, which is one of a high pass filter and a band pass filter passing signals with frequency above a second frequency threshold; if the upstream bandwidth requirement is determined to be a second bandwidth, operating the switch to pass the input signal through the low pass filter and the second filter, wherein output signals of the low pass filter and the second filter are combined to form the upstream signal.

In one embodiment, the method further comprises if the upstream bandwidth requirement is determined to be a third bandwidth, operating the switch and a second switch to pass the input signal through the low pass filter, the second filter, and a third filter, which is one of a high pass filter and a band pass filter passing signals with frequency above a third frequency threshold, wherein output signals of the low pass filter, the second filter and the third filter are combined to form the upstream signal.

In one embodiment, frequency range of the input signal is one of 5-42 MHz and 5-85 MHz, and the first, second frequency thresholds are respectively 42 MHz, 54 MHz.

In accordance with another aspect of the present disclosure, a non-transitory computer readable medium having stored thereon instructions of program code for executing the methods described in this disclosure, when said program code is executed by a processor, is disclosed.

In accordance with another aspect of the present disclosure, a switching device is disclosed. The switching device comprises a low pass filter passing signals with frequency below a first frequency threshold, the low pass filter having a first input and a first output; a second filter being one of a high pass filter and a band pass filter passing signals with frequency above a second frequency threshold, the second filter having a second input and a second output; and a switch for connecting the second input to a termination in a first state and connecting the second input to the first input in a second state, wherein the first output is coupled to the second output and the first input is configured to receive an input signal having a frequency range covering at least the first frequency threshold. In one embodiment, wherein the frequency range covers the second frequency threshold.

In one embodiment, the switching device further comprises a third filter being one of a high pass filter and a band pass filter passing signals with frequency above a third frequency threshold greater than the second frequency threshold, an output of the third filter is coupled to the first and the second outputs.

In one embodiment, the frequency range is one of 5-42 MHz and 5-85 MHz, and the first, second frequency thresholds are respectively 42 MHz, 54 MHz.

BRIEF DESCRIPTION OF THE DRAWINGS

The above and other aspects, features, and advantages of the present disclosure will become more apparent in light of the following detailed description when taken in conjunction with the accompanying drawings in which.

The images in the drawings are simplified for illustrative purposes and are not depicted to scale.

The appended drawings illustrate exemplary embodiments of the present disclosure and, as such, should not be considered as limiting the scope of the disclosure that may admit to other equally effective embodiments. Correspondingly, it has been contemplated that features or steps of one embodiment may beneficially be incorporated in other embodiments without further recitation.

DETAILED DESCRIPTION

It should be understood that the elements shown in the figures may be implemented in various forms of hardware, software or combinations thereof. Preferably, these elements are implemented in a combination of hardware and software on one or more appropriately programmed general-purpose devices, which may include a processor, memory and input/output interfaces. Herein, the phrase "coupled" is defined to mean directly connected to or indirectly connected with through one or more intermediate components. Such intermediate components may include both hardware and software based components.

The present description illustrates the principles of the present disclosure. It will thus be appreciated that those skilled in the art will be able to devise various arrangements that, although not explicitly described or shown herein, embody the principles of the disclosure and are included within its spirit and scope.

All examples and conditional language recited herein are intended for educational purposes to aid the reader in understanding the principles of the disclosure and the concepts contributed by the inventor to furthering the art, and are to be construed as being without limitation to such specifically recited examples and conditions.

Moreover, all statements herein reciting principles, aspects, and embodiments of the disclosure, as well as specific examples thereof, are intended to encompass both structural and functional equivalents thereof. Additionally, it is intended that such equivalents include both currently known equivalents as well as equivalents developed in the future, i.e., any elements developed that perform the same function, regardless of structure.

Thus, for example, it will be appreciated by those skilled in the art that the block diagrams presented herein represent conceptual views of illustrative system components and/or circuitry embodying the principles of the disclosure. Similarly, it will be appreciated that any flow charts, flow diagrams, state transition diagrams, pseudocode, and the like represent various processes which may be substantially represented in computer readable media and so executed by a computer or processor, whether or not such computer or processor is explicitly shown.

The functions of the various elements shown in the figures may be provided through the use of dedicated hardware as well as hardware capable of executing software in association with appropriate software. When provided by a processor, the functions may be provided by a single dedicated processor, by a single shared processor, or by a plurality of individual processors, some of which may be shared. Moreover, explicit use of the term "processor", "module" or "controller" should not be construed to refer exclusively to hardware capable of executing software, and may implicitly include, without limitation, a System on a Chip (SoC), digital signal processor ("DSP") hardware, read only memory ("ROM") for storing software, random access memory ("RAM"), and nonvolatile storage.

Other hardware, conventional and/or custom, may also be included. Similarly, any switches shown in the figures are conceptual only. Their function may be carried out through the operation of program logic, through dedicated logic, through the interaction of program control and dedicated logic, or even manually, the particular technique being selectable by the implementer as more specifically understood from the context.

In the embodiments hereof, any element expressed or described as a means for performing a specified function is intended to encompass any way of performing that function including, for example, a) a combination of circuit elements that performs that function or b) software in any form, including, therefore, firmware, microcode or the like, combined with appropriate circuitry for executing that software to perform the function. The disclosure as defined by such claims resides in the fact that the functionalities provided by the various recited means are combined and brought together in the manner which the claims call for. It is thus regarded that any means that can provide those functionalities are equivalent to those shown herein.

The present disclosure is directed to an apparatus for controlling a filter circuit in a signal communication device. Specifically, the embodiments describe an implementation that simplifies the operation of a DOCSIS upstream filter circuit used in a cable modem or gateway device capable of operating using two different upstream frequency ranges. A typical DOCSIS network may use a legacy 5-42 MHz upstream frequency or may use the new expanded 5-85 MHz range and devices are usually configured to support one range or the other but not both in the same device. The present embodiments use a cost effective switchable filter design that allows the device to operate on 5-42 MHz if the network is operating in this range and switch to 5-85 MHz range when needed without swapping the device or the software in the device. The present embodiments provide a solution to the upstream frequency range issues present with DOCSIS 3.1 network compatibility that is low cost, improves surge performance, and improves system return loss.

Figure 1:
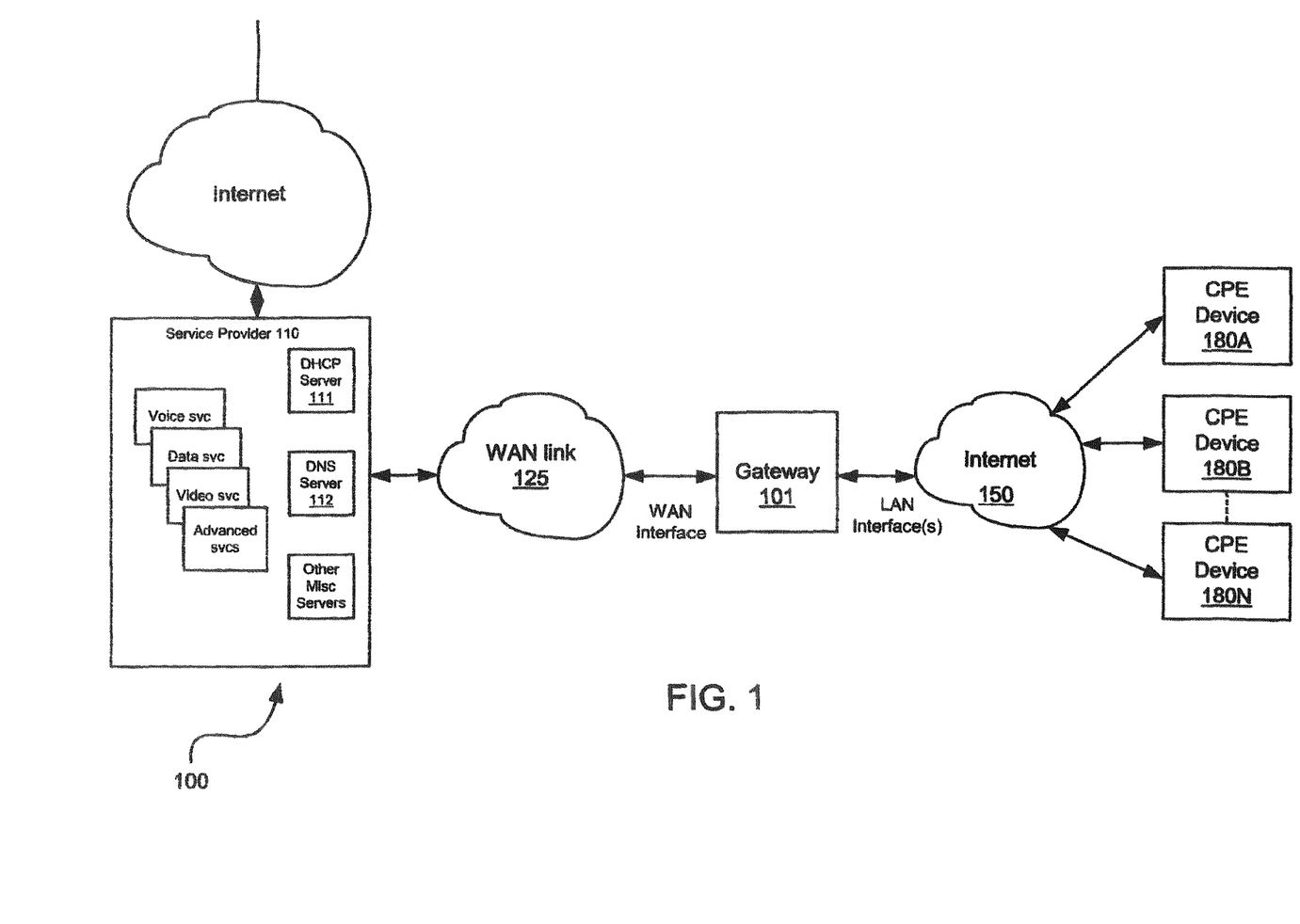
FIG. 1 is a block diagram of a typical arrangement for a networking communication system in accordance with an embodiment of the present disclosure.

Turning to FIG. 1, a block diagram of a typical arrangement for a networking communication system 100 according to aspects of the present disclosure is shown. According to an exemplary embodiment, gateway 101 is an advanced cable gateway, cable modem, DSL (Digital Subscriber Line) modem or the like, and is coupled to a wide area network (WAN) link 125 through a WAN interface to service provider 110. The WAN link 125 may be any one or more of the possible communication links including, but not limited to, coaxial cable, fiber optic cable, telephone line, or over the air links. The gateway 101 is also coupled via a local area network (LAN) interface to home network 150 which couples one or more customer premises equipment (CPE) devices 180A-N. The home network 150 preferably includes a wireless link but may also include wired links such as co-axial cable or Ethernet. CPE devices 180A-N may include, for example, personal computers, network printers, digital set-top boxes, and/or audio/visual media servers and players, among others.

Service provider 110 provides one or more services, such as voice, data, video and/or various advanced services, over WAN link 125 to CPE devices 180A-N through gateway 101 and home network 150. Service provider 110 may include Internet related services and server structures such as a DHCP server 111 and DNS server 112, and may include other servers and services as well (e.g., video on demand, news, weather). It is important to note that these servers and services can be co-located or widely distributed, physically and/or virtually, in both hardware and software. It is contemplated that service provider 110 operates in a conventional manner in accordance with well-known protocols (e.g., DOCSIS). In an illustrative cable application, service provider 110 may be, for example, a cable multiple service operator (MSO).

Gateway 101 acts as the interface between the WAN link 125 external to the customer's home and the home network 150 located in the customer's home. Gateway 101 converts transport data packets, such as packets in an IP protocol, from a format used in the WAN to a format used in the home network or LAN. Gateway 101 also routes data packets, including the converted data packets between the WAN and one or more devices on the home network. Gateway 101 may include interfaces for both wired networking (e.g., Ethernet or Multimedia over Coaxial cable Alliance (MoCA)) and wireless networking. Gateway 101 allows data, voice, video and audio communication between the WAN and CPE devices 180A-N used in the customer's home, such as analog telephones, televisions, computers, and the like.

It is important to note that in some configurations, the gateway 101 may be partitioned into two separate devices coupled together in some communicative manner. The first device, connected to the WAN portion of the system, may be referred to as a cable modem or network termination device (NTD). The second device, connected to the home LAN portion of the system, may be referred to as a home router, a home server, or a home gateway. Functionally, and as will be described below, the two devices operate in a manner consistent with gateway 101.

Figure 2:
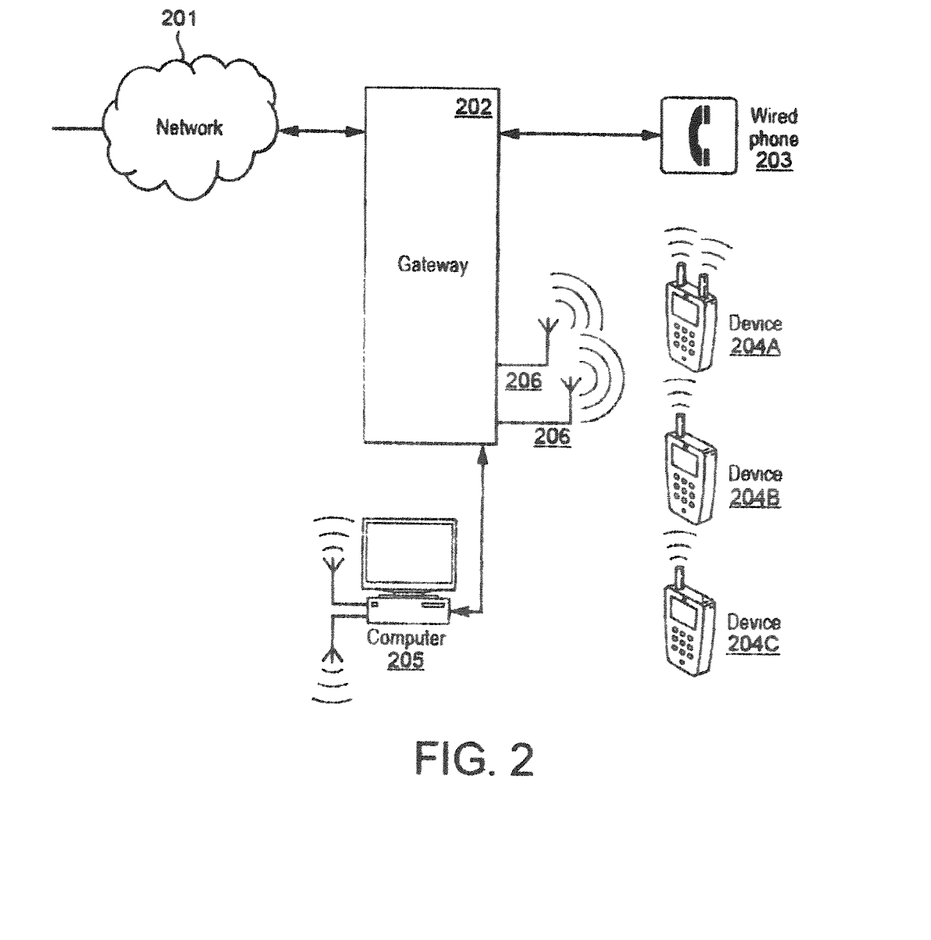
FIG. 2 is a block diagram of a gateway system in accordance with an embodiment of the present disclosure.

FIG. 2, shows a gateway system 200 according to aspects of the present disclosure is shown. Gateway system 200 operates in a manner similar to networking communication system 100 described in FIG. 1. In gateway system 200, network 201 is coupled to gateway 202, which is equivalent to gateway 101. Gateway 202 connects to a wired phone 203. Gateway 202 also connects to computer 205. In addition, gateway 202 interfaces with devices 204A-204C through a wireless interface using one or more antennas 206. Gateway 202 may also interface with computer 205 using the one or more antennas 206.

In particular, gateway system 200 operates as part of a cable network interface and acts to interface a packet data cable system to one or more home networks. Gateway system 200 includes gateway 202 that provides the interface between the network 201, operating as a WAN, and the home network(s). Gateway system 200 also includes wired analog telephone device 203 capable of operating as a home telephone when connected through gateway 202. In addition, gateway 202 also acts to provide a radio frequency (RF) interface to multiple wireless devices 204A, 204B, and 204C. Wireless device 204A, 204B, and 204C are handheld devices that operate using wireless packet transmissions via one or more antennas 206 on gateway 202. In other embodiments, other devices with wireless interfaces including, but not limited to routers, tablets, set-top boxes, televisions, and media players may be used.

The wireless interface included in gateway 202 may also accommodate one or more wireless formats including Wi-Fi, Institute of Electrical and Electronics Engineers standard IEEE 802.11 or other similar wireless communication protocols. Further, it is important to note that each antenna in the system may be attached to a separate transceiver circuit. As shown in FIG. 2, gateway 202 includes two transceiver circuits and two antennas. Device 204A and computer 205 also include two transceiver circuits and two antennas while device 204B and device 204C include only one transmit/ receive circuit and one antenna. In some alternate designs it may be possible that more than one antenna may be included with, and used by, a single transceiver circuit.

In operation, gateway 202 provides Internet protocol (IP) services (e.g., data, voice, video, and/or audio) between devices 204A-C and Internet destinations identified and connected via network 201. Gateway 202 also provides IP voice services between wired phone 203 and call destinations routed through network 201. Gateway 202 further provides connectivity to a local computer 205 either via a wired connection such as is shown in FIG. 2 or via a wireless connection through one or more antennas and transceiver circuits. Thus, example interfaces for computer 205 include Ethernet and IEEE 802.11. As noted above, gateway 202 may physically be configured as two components, a cable modem or NTD that connects to network 201 and a home gateway that connects to all other devices in the home.

Gateway 202 further includes a communication front end circuit for interfacing with the headend or CMTS through the network 201. In some embodiments, the gateway 202 further includes circuitry for communicating in the home network or LAN using MoCA protocols over a co-axial cable. The communication front end circuit includes a diplexer filter, or a triplexer filter if MoCA is included, for separating the upstream communication and downstream communication signals (as well as MoCA signals if present). Further details regarding the implementation of the diplexer/triplexer filter in accordance with the present disclosure will be described below. Further, the embodiment described here primarily is used in a cable system, and more particularly is used in a system using DOCSIS 3.1 protocols. It is likely that the present embodiments will also be useful in future advancement of the cable data protocols. As such, the present embodiments may be primarily used in a cable modem device or a gateway that employ data modem functionality. However, other devices, such as communication devices, that include data modem or any other form of two communication functionality may also include the aspects of the present embodiments.

Figure 3:
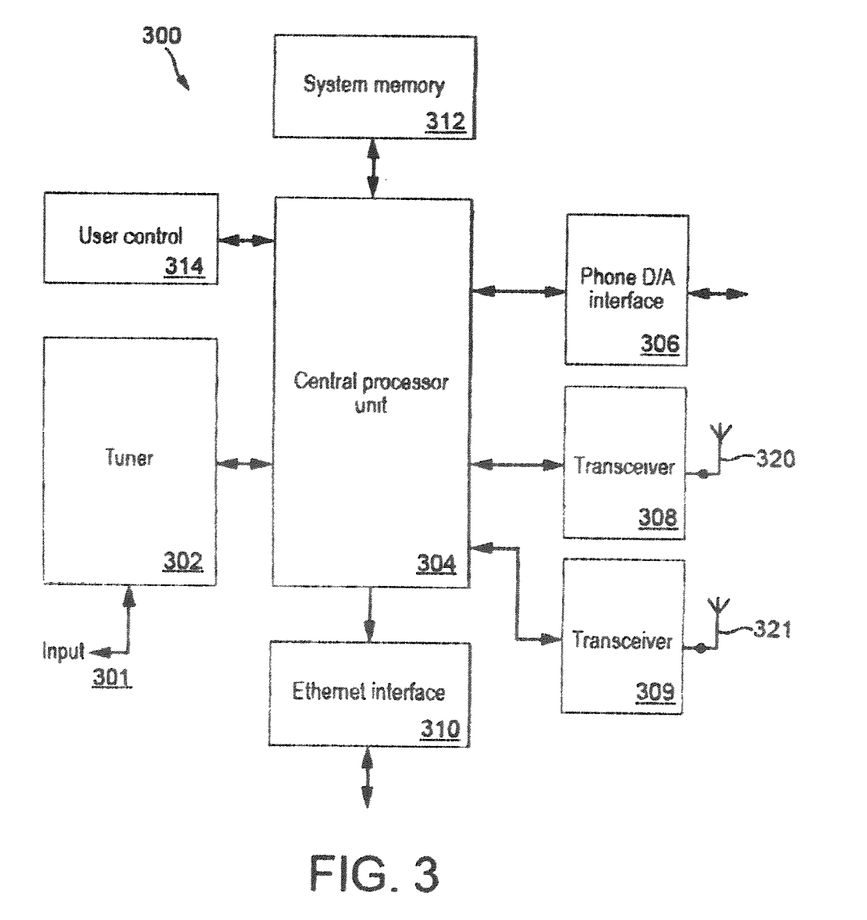
FIG. 3 is a block diagram of an exemplary gateway device in accordance with an embodiment of the present disclosure.

Turning to FIG. 3, a block diagram of an exemplary gateway device 300 according to aspects of the present disclosure is shown. Gateway device 300 may correspond to gateway 202 described in FIG. 2 or to gateway 101 described in FIG. 1. In gateway device 300, an input signal is provided to RF input 301. RF input 301 connects to tuner 302. Tuner 302 connects to central processor unit 304. Central processor unit (CPU) 304 connects to phone D/A (digital to analog) interface 306, transceiver 308, transceiver 309, Ethernet interface 310, system memory 312, and user control 314. Transceiver 308 further connects to antenna 320. Transceiver 309 further connects to antenna 321. It is important to note that several components and interconnections necessary for complete operation of gateway device 300 are not shown in the interest of conciseness, as the components not shown are well known to those skilled in the art. Gateway device 300 may be capable of operating as an interface to a cable communication network and further may be capable of providing an interface to one or more devices connected through either a wired and wireless home network.

A signal, such as a cable signal on the WAN, is interfaced to tuner 302 through RF input 301. Tuner 302 performs RF modulation functions on a signal provided to the WAN and demodulation functions on a signal received from the WAN. The RF modulation and demodulation functions are the same as those commonly used in communication systems, such as cable systems. Central processor unit 304 accepts the demodulated cable signals and digitally processes the signal from tuner 302 to provide voice signals and data for the interfaces in gateway 300. Similarly, central processor unit 304 also processes and directs any voice signals and data received from any of the interfaces in gateway 300 for delivery to tuner 302 and transmission to the WAN.

System memory 312 supports the processing and IP functions in central processor unit 304 and also serves as storage for program and data information. A portion of system memory 312 is a non-transitory computer readable medium having stored thereon instructions of program code for executing methods according to any embodiment described in this disclosure, when the program code is executed on a computer. Processed and/or stored digital data from central processor unit 304 is available for transfer to and from Ethernet interface 310. Ethernet interface may support a typical Registered Jack type RJ-45 physical interface connector or other standard interface connector and allow connection to an external local computer. Processed and/or stored digital data from central processor unit 304 is also available for digital to analog conversion in interface 306. Interface 306 allows connection to an analog telephone handset. Typically, this physical connection is provided via an RJ-11 standard interface, but other interface standards may be used. Processed and/or stored digital data from central processor unit 304 is additionally available for exchange with transceiver 308 and transceiver 309. Transceiver 308 and transceiver 309 can both support multiple operations and networked devices simultaneously. Central processor unit 304 is also operative or configured to receive and process user input signals provided via a user control interface 314, which may include a display and/or a user input device such as a hand-held remote control and/or other type of user input device.

As noted above, the gateway device 300 may be configured to operate as an NTD. In this case, central processing unit 304 may only connect to tuner 302, Ethernet interface 310, and system memory 312. Phone D/A interface 306, transceiver 308 and/or transceiver 309 may not be present or used. Further, an NTD may not include a direct user interface and as such may not include user control 314. Additionally, the NTD may include and support more than one Ethernet interface 310 and may be capable operating each Ethernet interface as a separate virtual circuit between the content service provider(s) and the home gateway attached to the Ethernet interface, thus allowing the creation of separate LANs for each content consumer.

Also, as described earlier, gateway device 300 may include one or more diplexer or triplexer filters in tuner 302. One filter may include one or more low pass filters and high pass filters for filtering or separating the frequency ranges used for upstream and downstream communication in the WAN (e.g., as part of DOCSIS protocol). Another filter may be used to filtering or separating signals in the frequency range used for MoCA communications in the home network. A filter includes a set of low pass and high pass filters that are coupled together and includes a switching arrangement to provide for reconfiguration of the filter structure to support at least one or two possible upstream network configurations (e.g., 5-42 MHZ or 5-85 MHz). One embodiment of a filter structure will be described below in FIG. 4.

Figure 4:
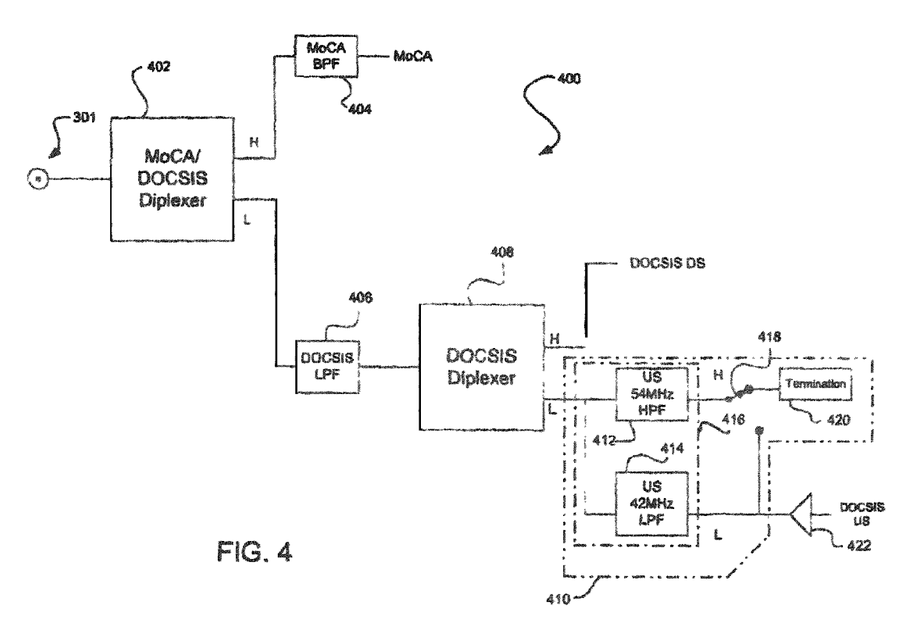
FIG. 4 is a block diagram of a filter structure in accordance with the present disclosure.

Referring to FIG. 4 a block diagram of a circuit 400 including a plurality of filters is shown in accordance with the present disclosure. It is to be appreciated that in one embodiment of the present disclosure circuit 400 may be included in tuner 302 of gateway device 300 or in the circuitry of gateway 101 or gateway 202.

As described above, input/output 301 may interface upstream and downstream signals between a gateway device, such as gateway device 300 and a service provider, such as service provider 110. In FIG. 4, the input/output 301 is coupled to a MoCA/DOCSIS diplexer 402. Diplexer 402 is coupled to MoCA band-pass filter (BPF) 404 and DOCSIS low-pass filter (LPF) 406. In one embodiment, diplexer 402 filters an input signal 301 received from the service provider 110 via the WAN and provides signals in the frequency range of 1125 MHz to 1625 MHz (MoCA D band) to MoCA BPF 404 and signals in the frequency range of 5 MHz to 1002 MHz to DOCSIS LPF 406. DOCSIS LPF 406 is coupled to DOCSIS diplexer 408.

DOCSIS diplexer 408 filters signals received from DOCSIS LPF 406 and provides downstream signals in the frequency range of 108 MHz to 1002 MHz (i.e., downstream signals denoted as DOCSIS DS in FIG. 4) to CPU 304 of gateway 300. Furthermore, DOCSIS diplexer 408 filters signals received from DOCSIS LPF 406 and provides signals in the frequency range of 5 MHz to 85 MHz to both upstream high-pass filter (HPF) 412 and upstream low-pass filter (LPF) 414, where HPF 412 and LPF 414 together form diplexer 416. HPF 412 receives the 5 MHz to 85 MHz signal from DOCSIS diplexer 408 and filters signals below a second frequency threshold, which is 54 MHz in this example, and only passes signals above 54 MHz, therefore HPF 412 only outputs the 54 MHz to 85 MHz portion of the received signal from DOCSIS diplexer 408. The functions of HPF 412 are the same in the upstream direction. HPF 412 is coupled to a switch 418, where, in one embodiment, switch 418 is a single pole, double throw switch that is coupled to and controlled by CPU 304. Switch 418 is further coupled to termination element 420. Switch 418 can be an electronic or electro-mechanical switch as well.

In one embodiment, HPF 412 is bandpass filter having the second frequency threshold, which is 54 MHz in this example, as the low frequency pass threshold and 85 MHz in this example as the high frequency pass threshold.

LPF 414 receives 5 MHz to 85 MHz signals from DOCSIS diplexer 408 and filters signals above a first threshold, which is 42 MHz, in this example, and only passes signals below 42 MHz, therefore LPF 414 only outputs the 5 MHz to 42 MHz portion of the received signal from the DOCSIS diplexer 408. The functions of LPF 414 are the same in the upstream direction. LPF 414 is coupled to an upstream power amplifier 422, where upstream power amplifier 422 is further coupled to a digital-to-analog converter output of CPU 304 of gateway 300 (not shown). It is to be appreciated that when CPU 304 outputs upstream communication, denoted as DOCSIS US in FIG. 4, to upstream power amplifier 422, the upstream power amplifier 422 is configured to provide a signal of sufficient amplitude from gateway 300 (via input/output 301) to be received by the service provider 110 over the WAN. It is to be appreciated that HPF 412, LPF 414, switch 418, and termination element 420 comprise switching circuitry 410.

As shown in FIG. 4, LPF 414 has a first input for receiving upstream signal from upstream power amplifier 422 and a first output for outputting the filtered signal to DOCSIS diplexer 408, and HPF 412 has a second input that either is coupled to termination 420 or the first input of LPF 412 depending on the switch position of switch 418, and a second output is coupled to the first output of LPF 414 to provide upstream signal to DOCSIS diplexer 408. CPU 304 sends a control signal to control switch 418 according to upstream bandwidth requirement. If the upstream bandwidth requirement is determined to be a first bandwidth (e.g., 5-42 MHz), CPU 304 is configured or operative to generate the control signal to place switch 418 in the first state, in which the second input of HPF 412 is connected to termination 420, and if the upstream bandwidth requirement is determined to be a second bandwidth (e.g., 5-85 MHz), CPU 304 is configured or operative to generate the control signal to place the switch in the second state, in which the second input of HPF 412 is coupled to the first input of LPF 414.

Upstream signals from the power amplifier 422 to the first input of LPF 414 should have frequency band including at least the first frequency threshold, which is 42 MHz in this example, or both the first frequency threshold and second frequency threshold, which is 54 MHz in this example, depending on the upstream bandwidth requirement.

As stated above, service provider 110 may use a 5-42 MHZ bandwidth or a 5-85 MHz bandwidth in upstream communication over the WAN with a device, such as gateway 300. The bandwidth selected by the service provider is configured by an MIB (Management Information Base) entry, where the MIB entries are communicated via the WAN to devices on the WAN, such as gateway 300. In an alternative, according to the cross-version compatibility requirement of DOCSIS, CPU 304 must agree with the headend or CMTS a version of DOCSIS to use. If the version is DOCSIS 3.1, a 5-85 MHz upstream bandwidth is supported by the service provider. Otherwise, a 5-42 MHz upstream bandwidth is supported by the service provider. Therefore, when service provider 110 chooses to a 5-42 MHz upstream bandwidth or a 5-85 MHz upstream bandwidth, CPU 304 can determine, based on the MIB entry received from the service provider or the agreed version of DOCSIS, which bandwidth the service provider 110 has chosen to use. When the 5-42 MHz upstream bandwidth is being used by the service provider 110, CPU 304 will place switch 418 in a first position as shown in FIG. 4, where in the first position, HPF 412 is coupled to termination element 420. When HPF 412 is coupled to termination element 420, all upstream communication signals in the frequency range of 54 MHz to 85 MHz (as outputted by HPF 412) will be terminated in termination element 420 to protect the return loss in the WAN network in case service provider 110 intends to use the 54 MHz to 85 MHz frequency range for downstream communication.

Alternatively, when the 5-85 MHz upstream bandwidth is being used by the service provider 110, CPU 304 will place switch 418 in a second position, opposite to the position shown in FIG. 4. When switch 418 is in a second position, the outputted signal from HPF 412 is provided to upstream power amplifier 422. In this way, when switch 418 is in a second position, the combination of HPF 412 and LPF 414 form an all-pass filter, where upstream communication can take place in the frequency range of 5 MHz to 85 MHz.

It is to be appreciated that, in one embodiment, CPU 304 is configured to default with a 5-42 MHz upstream bandwidth until CPU 304 receives an MIB entry indicating that a 5-85 MHz upstream bandwidth is to be used by the service provider or agrees with the service provider to use DOCSIS 3.1.

Furthermore, it is to be appreciated that although circuit 400 above has been described for use in systems using upstream bandwidth of 5-42 MHz or 5-85 MHz, in other embodiments, circuit 400 may be adapted to switch between other upstream bandwidths in different frequency ranges.

Furthermore, HPF 412 may be replaced by a bandpass filter passing signal with frequency between 54 MHz and 85 MHz.

Furthermore, diplexer 416 can be modified to support more than two upstream network configurations. For example, in addition to support upstream bandwidths of 5-42 MHz and 5-85 MHz, DOCSIS may support a higher bandwidth, for example, 5-200 MHz in the future. In this scenario, diplexer 416 may be modified to include LPF 414, HPF 412 becomes a bandpass filter with frequency range 54-85 MHz, and a third filter, which is either a high pass filter for passing signals with frequency above 99 MHz or a bandpass filter with frequency range of 99-200 MHz. The band 85-99 MHz is a guard band between the two bands 5-85 MHz and 99-200 MHz. Similarly, the band 42-54 MHz is the guard band between the two bands 5-42 MHz and 54-85 MHz. The outputs of the three filters are coupled together to provide upstream signals to DOCSIS diplexer 408. In addition to switch 418, a second switch, also controllable by CPU 304, is added. If 5-42 MHz is used, switch 418 is operated such that the input of the bandpass filter with frequency range of 54-85 MHz is coupled to termination 420 and the second switch is operated, such that the input of the high pass filter for passing signals with frequency above 99 MHz or the bandpass filter with frequency range of 99-200 MHz is coupled to termination 420. If 5-85 MHz is used, switch 418 is operated such that the input of the bandpass filter with frequency range of 54-85 MHz is coupled to the first input of LPF 414 and the second switch is operated, such that the input of the high pass filter for passing signals with frequency above 99 MHz or the bandpass filter with frequency range of 99-200 MHz is coupled to termination 420. If 5-200 MHz is used, switch 418 is operated such that the input of the bandpass filter with frequency range of 54-85 MHz is coupled to the first input of LPF 414 and the second switch is operated, such that the input of the high pass filter for passing signals with frequency above 99 MHz or the bandpass filter with frequency range of 99-200 MHz is coupled to the first input of LPF 414. This principle can be extended to supporting four or more upstream network configurations. For example, if four upstream network configurations are supported, a third switch is required, the third filter becomes a bandpass filter, and a fourth filter, which is a high pass filter or a bandpass filter, is required.

Figure 5:
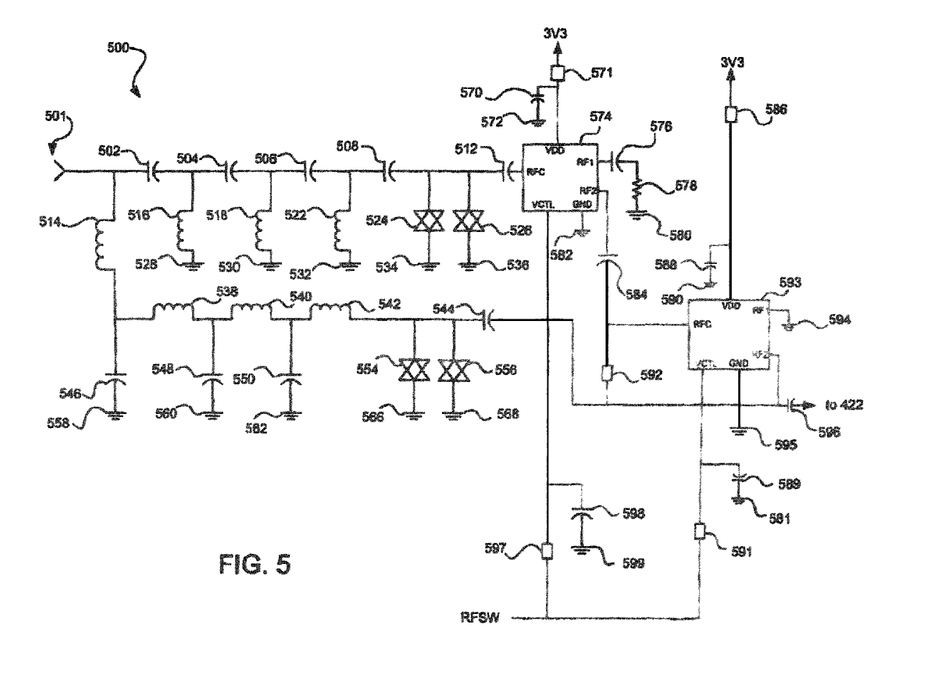
FIG. 5 is a circuit diagram in accordance with an embodiment of the present disclosure.

Referring to FIG. 5, a circuit 500 is shown in accordance with the present disclosure, where circuit 500 corresponds to switching circuitry 410 of FIG. 4. It is to be appreciated that the input 501 of circuit 500 is the low-pass output from DOCSIS diplexer 408 (indicated as "L" in FIG. 4 as one of the outputs of DOCSIS diplexer 408).

Input 501 of circuit 500 is coupled to capacitor 502 and inductor 514. Capacitor 502 is coupled to capacitor 504 and inductor 516, where inductor 516 is further coupled to ground 528. Capacitor 504 is coupled to capacitor 506 and inductor 518, where inductor 518 is further coupled to ground 530. Capacitor 506 is coupled to capacitor 508 and inductor 522, where inductor 522 is further coupled to ground 532. It is to be appreciated that capacitors 502, 504, 506, 508 and inductors 516, 518, and 522 comprise HPF 412 of FIG. 4. It is to be appreciated that HPF 412 uses a Chebyshev filter topology, however in other embodiments, other topologies could be used. Capacitor 508 is coupled to capacitor 512 and capacitor 512 is coupled to the RFC pin of switch 574, as will be described in greater detail below.

It is to be appreciated that, in one embodiment, capacitor 508 is further coupled to surge protection diodes 524 and 526, where surge protection diode 524 is coupled to ground 534 and surge protection diode 526 is coupled to ground 536. It is to be appreciated that surge protection diodes 524 and 526 may be included as necessary to protect against surge energy.

Referring again to inductor 514, inductor 514 is further coupled to inductor 538 and capacitor 546, where capacitor 546 is further coupled to ground 558. Inductor 538 is coupled to inductor 540 and capacitor 548, where capacitor 548 is coupled to ground 560. Inductor 540 is coupled to inductor 542 and capacitor 550, where capacitor 550 is coupled to ground 562. It is to be appreciated that inductors 514, 538, 540, and 542 and capacitors 546, 548, and 550 comprise LPF 414 of FIG. 4. It is to be appreciated that LPF 414 uses a Chebyshev filter topology, however in other embodiments, other topologies could be used. Inductor 542 is coupled to capacitor 544.

Furthermore, it is to be appreciated that, in one embodiment, inductor 542 is further coupled to surge protection diodes 554 and 556, where surge protection diode 554 is further coupled to ground 566 and surge protection diode 556 is further coupled to ground 568. It is to be appreciated that surge protection diodes 554 and 556 may be included as necessary to protect against surge energy.

As stated above, capacitor 512 is coupled to the RFC pin of switch 574 (i.e., the common port of RF switch 574), where it is to be appreciated that switch 574 is the same as switch 418 of FIG. 4. The VCTL (DC control voltage) pin of switch 574 is coupled to ferrite bead 597 and capacitor 598, where capacitor 598 is coupled to ground 599. The VDD (supply voltage) pin of switch 574 is coupled to ferrite bead 571 and capacitor 570, where capacitor 570 is coupled to ground 572. The RF1 pin of switch 574 is coupled to capacitor 576, where the RF1 pin of switch 574 corresponds to the first position of switch 418 (as shown in FIG. 4). Capacitor 576 is coupled to resistor 578, where resistor 578 is termination element 420 of FIG. 4. Resistor 578 is coupled to ground 580. The RF2 pin of switch 574 is coupled to capacitor 584, where the RF2 pin of switch 574 corresponds to the second position of switch 418 (opposite to the opposition shown in FIG. 4). The GND pin of switch 574 is coupled to ground 582.

CPU 304 can control switch 574 via the RFSW input signal shown in FIG. 5. As stated above, CPU 304, based on the DOCSIS protocol being used, can determine which pole (RF1 or RF2) of switch 574 is asserted. When DOCSIS 3.0 is being used, RF1 is asserted by CPU 304 and the input signal received at pin RFC via capacitor 512 is terminated at resistor 578. Alternatively, when DOCSIS 3.1 is being used, RF2 is asserted by CPU 305 and the input signal received at pin RFC via capacitor 512 is outputted to capacitor 584. As discussed previously, CPU 304 can also determine the upstream bandwidth requirement from the MIB. If 5-42 MHz is used, CPU 304 operates as described above with respected to DOCSIS 3.0 and if 5-85 MHz is used, CPU 304 operates as described above with respect to DOCSIS 3.1.

In one embodiment, circuit 500 includes a second switch 593, where switch 593 is similar to switch 574 to provide sufficient isolation. In this embodiment jumper 592 is removed and the output of capacitor 584 is coupled to the RFC pin of switch 593. The VDD pin of switch 593 is coupled to capacitor 588 and ferrite bead 586, where capacitor 588 is further coupled to grounds 590. The other side of the ferrite bead 586 is connected to a voltage source. The RF1 pin of switch 593 is coupled to ground 594. The RF2 pin of switch 593 is coupled to capacitor 596. The VCTL pin of switch 593 is coupled to ferrite bead 591. It is to be appreciated that CPU 304 can control switch 593 (i.e. select between poles RF1 and RF2) by asserting and deasserting the RFSW signal on pin VCTL of switch 593. The GND pin of switch 593 is coupled to ground 595. It is to be appreciated that in another embodiment if it is determined that there is sufficient isolation in the circuit without the use of switch 593, switch 593 can be removed from circuit 500 and jumper 592 will couple capacitor 584 to capacitor 596. It is to be appreciated that the output of capacitor 596 is coupled to upstream power amplifier 422.

It is to be appreciated that the present disclosure provides for a single switch (or two switches cascaded for isolation) on the side of the filters facing the upstream power amplifier (i.e., filters 412 and 414). Any harmonics produced out of band will be attenuated by the filters 412 (in the case of a band pass filter) and 414, and the low pass port of diplexer 408. Furthermore, the switches are far from the cable, providing isolation for protection from surges. In the embodiments of the present disclosure, lower cost switches can be used because of both the harmonic suppression and surge isolation.

Below, a table including the reference number, element type, and value corresponding to each element in circuit 500 is shown below in accordance with the present disclosure:

| Reference # | Element Type | Value |
|---|---|---|
| 502 | Capacitor | 24 pF |
| 504 | Capacitor | 20 pF |
| 506 | Capacitor | 15 pF |
| 508 | Capacitor | 20 pF |
| 512 | Capacitor | 10 nF |
| 514 | Inductor | 470 nH |
| 516 | Inductor | 150 nH |
| 518 | Inductor | 180 nH |
| 522 | Inductor | 200 nH |
| 524 | Surge Protection Diode | Littelfuse |
| 526 | Surge Protection Diode | Littelfuse |
| 538 | Inductor | 560 nH |
| 540 | Inductor | 560 nH |
| 542 | Inductor | 470 nH |
| 544 | Capacitor | 10 nF |
| 546 | Capacitor | 68 pF |
| 548 | Capacitor | 68 pF |
| 550 | Capacitor | 68 pF |
| 554 | Surge Protection Diode | Littelfuse |
| 556 | Surge Protection Diode | Littelfuse |
| 570 | Capacitor | 1 nF |
| 571 | Inductor | 600 Ω at 100 MHz |
| 574 | Switch | 75 Ω |
| 576 | Capacitor | 10 nF |
| 578 | Resistor | 82 Ω |
| 584 | Capacitor | 10 nF |
| 586 | Inductor | 600 Ω at 100 MHz |
| 588 | Capacitor | 1 nF |
| 589 | Capacitor | 100 pF filter |
| 591 | Inductor | 600 Ω at 100 MHz |
| 592 | Resistor | 0 Ω Jumper-Switch Bypass, used when only switch 574 populated, switch 593 not populated, if isolation requirements of switch 574 alone are sufficient. |
| 593 | Switch | 75 Ω |
| 596 | Capacitor | 10 nF |
| 597 | Inductor | 600 Ω at 100 MHz |
| 598 | Capacitor | 100 pF Filter |
| 528 | Ground | N/A |
| 530 | Ground | N/A |
| 532 | Ground | N/A |
| 534 | Ground | N/A |
| 536 | Ground | N/A |
| 558 | Ground | N/A |
| 560 | Ground | N/A |
| 562 | Ground | N/A |
| 566 | Ground | N/A |
| 568 | Ground | N/A |
| 572 | Ground | N/A |
| 580 | Ground | N/A |
| 581 | Ground | N/A |
| 582 | Ground | N/A |
| 590 | Ground | N/A |
| 594 | Ground | N/A |
| 595 | Ground | N/A |
| 599 | Ground | N/A |

It is to be appreciated that the various features shown and described are interchangeable, that is, a feature shown in one embodiment may be incorporated into another embodiment.

Figure 6:
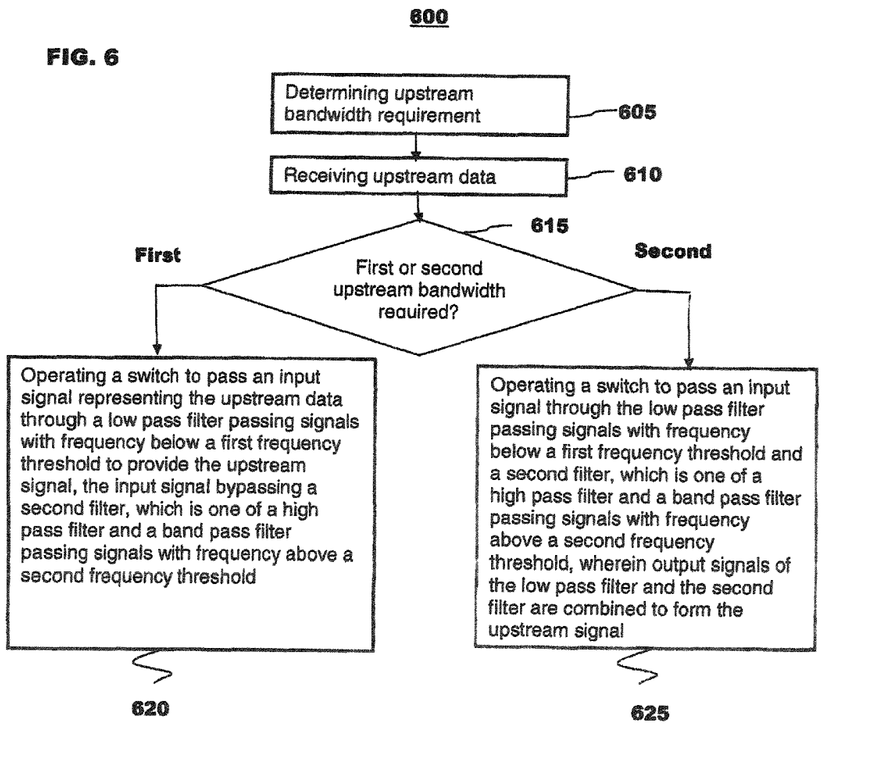
FIG. 6 is an exemplary process executed by a gateway in accordance with an embodiment of the present disclosure.

Referring now to FIG. 6, an exemplary process 600 for switching upstream bandwidth requirement, according to the principles of the embodiments of the disclosure, is shown. For purposes of example and explanation only, the steps of FIG. 6 may be explained hereinafter with specific reference to the exemplary embodiments of FIGS. 3 and 4 described above. At step 605, CPU 304 of gateway 300 is operative or configured to determine upstream bandwidth requirement. As described previously, CPU 304 can determine the upstream bandwidth requirement from the MIB or the version of DOCSIS agreed upon with the headend or CMTS.

At step 610, CPU 304 is operative or configured to receive upstream data. As shown in FIG. 3, the upstream data may come from phone D/A interface 306, transceivers 320 and 321, and/or Ethernet interface 310.

At step 615, CPU 304 is operative or configured to determine if the upstream bandwidth requirement is a first bandwidth, for example, 5-42 MHz, or a second bandwidth, for example, 5-85 MHz.

At step 620, CPU 304 is operative or configured to operate a switch, for example, switch 418 in FIG. 4, to pass an input signal representing the upstream data through a low pass filter, for example LFP 414 in FIG. 4, passing signals with frequency below a first frequency threshold, for example, 42 MHz, to provide the upstream signal, the input signal bypassing a second filter (for example, HPF 412 in FIG. 4), which is one of a high pass filter and a band pass filter passing signals with frequency above a second frequency threshold, for example, 54 MHz, if the upstream bandwidth requirement is determined to be a first bandwidth, for example, 5-42 MHz.

At step 625, CPU 304 is operative or configured to operate the switch to pass the input signal through the low pass filter and the second filter, wherein output signals of the low pass filter and the second filter are combined to form the upstream signal, if the upstream bandwidth requirement is determined to be a second bandwidth.

If the communication device supports three different upstream configurations (for example, 5-42 MHz, 5-85 MHz, and 5-200 MHz), as described previously, the second filter is a bandpass filter (for example, with passband of 54-85 MH) with the second frequency threshold (for example, 54 MHz) as the low passing frequency, and a third filter, which may be bandpass filter with a third frequency threshold (for example, 99 MHz) as the low passing frequency, the third frequency threshold greater than the second frequency threshold, or a high pass filter passing signals with frequency over the third threshold. A second switch for switching an input of the third filter to either termination 420 in FIG. 4 or the input of LFP 414 is needed. In this case, CPU 304 is operative or configured to operate the switch and the added switch to pass the input signal through the low pass filter, the second filter, and the third filter, wherein output signals of the low pass filter, the second filter and the third filter are combined to form the upstream signal, if the upstream bandwidth requirement is determined to be a third bandwidth, for example, 5-200 MHz. Of course, if the upstream bandwidth requirement is the first or second bandwidth, CPU 304 is operative or configured to operate the second switch, such that the input signal bypasses the third filter and an input of the third filter is coupled to termination 420.

Although embodiments which incorporate the teachings of the present disclosure have been shown and described in detail herein, those skilled in the art can readily devise many other varied embodiments that still incorporate these teachings. Having described preferred embodiments of an apparatus for controlling a filter circuit in a signal communication device (which are intended to be illustrative and not limiting), it is noted that modifications and variations can be made by persons skilled in the art in light of the above teachings. It is therefore to be understood that changes may be made in the particular embodiments of the disclosure disclosed which are within the scope of the disclosure as outlined by the appended claims.

The invention claimed is:

1. A communication device comprising:
a processor; and
a diplexer comprising a low pass filter passing signals with frequency below a first frequency threshold, the low pass filter having a first input and a first output, and a second filter being one of a high pass filter and a band pass filter passing signals with frequency above a second frequency threshold, the second filter having a second input and a second output; and
a switch controllable by the processor for connecting the second input to a termination in a first state and connecting the second input to the first input in a second state responsive to a control signal from the processor, wherein
the first output is coupled to the second output,
the first input is configured to receive an input signal having a frequency range covering at least the first frequency threshold.

2. The communication device of claim 1, wherein the frequency range covers the second frequency threshold.

3. The communication device of claim 1, wherein the diplexer further comprises a third filter being one of a high pass filter and a band pass filter passing signals with frequency above a third frequency threshold greater than the second frequency threshold, and an output of the third filter is coupled to the first and the second outputs.

4. The communication device of claim 1, wherein the frequency range is one of 5-42 MHz and 5-85 MHz, and the first, second frequency thresholds are respectively 42 MHz and 54 MHz.

5. The communication device of claim 1, wherein the communication device is a cable modem and the processor is configured to determine upstream bandwidth requirement.

6. The communication device of claim 5, wherein if the upstream bandwidth requirement is determined to be a first bandwidth, the processor is configured to generate the control signal to place the switch in the first state, and if the upstream bandwidth requirement is determined to be a second bandwidth, the processor is configured to generate the control signal to place the switch in the second state.

7. The communication device of claim 6, wherein the first bandwidth is 5-42 MHz and the second bandwidth is 5-85 MHz.

8. A method of providing an upstream signal in a cable network, the method comprising:
determining upstream bandwidth requirement;
receiving upstream data;
if the upstream bandwidth requirement is determined to be a first bandwidth, operating a switch to pass an input signal representing the upstream data through a low pass filter passing signals with frequency below a first frequency threshold to provide the upstream signal, the input signal bypassing a second filter, which is one of a high pass filter and a band pass filter passing signals with frequency above a second frequency threshold;
if the upstream bandwidth requirement is determined to be a second bandwidth, operating the switch to pass the input signal through the low pass filter and the second filter, wherein output signals of the low pass filter and the second filter are combined to form the upstream signal.

9. The method of claim 8, further comprising if the upstream bandwidth requirement is determined to be a third bandwidth, operating the switch and a second switch to pass the input signal through the low pass filter, the second filter, and a third filter, which is one of a high pass filter and a band pass filter passing signals with frequency above a third frequency threshold, wherein output signals of the low pass filter, the second filter and the third filter are combined to form the upstream signal.

10. The method of claim 8, wherein frequency range of the input signal is one of 5-42 MHz and 5-85 MHz, and the first, second frequency thresholds are respectively 42 MHz, 54 MHz.

11. A non-transitory computer readable medium having stored thereon instructions of program code for executing the method according to claim 8, when said program code is executed by a processor.

12. A switching device comprising:
a low pass filter passing signals with frequency below a first frequency threshold, the low pass filter having a first input and a first output;
a second filter being one of a high pass filter and a band pass filter passing signals with frequency above a second frequency threshold, the second filter having a second input and a second output; and
a switch for connecting the second input to a termination in a first state and connecting the second input to the first input in a second state, wherein
the first output is coupled to the second output,
the first input is configured to receive an input signal having a frequency range covering at least the first frequency threshold.

13. The switching device of claim 12, wherein the frequency range covers the second frequency threshold.

14. The switching device of claim 12, further comprising a third filter being one of a high pass filter and a band pass filter passing signals with frequency above a third frequency threshold greater than the second frequency threshold, an output of the third filter is coupled to the first and the second outputs.

15. The switching device of claim 12, wherein the frequency range is one of 5-42 MHz and 5-85 MHz, and the first, second frequency thresholds are respectively 42 MHz, 54 MHz.

* * * * *